United States Patent [19]

Brandwein et al.

[11] 3,940,679

[45] Feb. 24, 1976

[54] NICKEL-CADMIUM BATTERY MONITOR

[75] Inventors: Rowland Brandwein, Mission; Mohan L. Gupta, Shawnee, Mission, both of Kans.

[73] Assignee: Textron, Inc., Providence, R.I.

[22] Filed: June 18, 1974

[21] Appl. No.: 480,479

[52] U.S. Cl. .................. 320/48; 340/249; 324/29.5
[51] Int. Cl.² .................. H02J 7/00; G01M 27/02
[58] Field of Search .................. 320/48, 2, 35, 36; 324/29.5; 340/248 B, 249

[56] References Cited
UNITED STATES PATENTS

| | | | |
|---|---|---|---|
| 2,509,485 | 5/1950 | Dalzell | 320/48 X |
| 2,835,862 | 5/1958 | McNutt | 320/48 X |
| 3,525,075 | 8/1970 | Frome et al. | 340/150 |
| 3,541,537 | 11/1970 | Kasson | 340/179 |
| 3,593,099 | 7/1971 | Scholl | 320/48 X |
| 3,626,398 | 12/1971 | Owens et al. | 340/183 |
| 3,641,530 | 2/1972 | Schoenwitz | 340/183 |
| 3,665,399 | 5/1972 | Zehr et al. | 340/152 |
| 3,665,439 | 5/1972 | Brummer et al. | 340/183 |
| 3,750,465 | 8/1973 | Howell et al. | 73/117.3 |
| 3,786,343 | 1/1974 | Ehlers | 324/29.5 |

FOREIGN PATENTS OR APPLICATIONS

| | | | |
|---|---|---|---|
| 1,227,630 | 4/1971 | United Kingdom | 320/48 X |

*Primary Examiner*—J. D. Miller
*Assistant Examiner*—Robert J. Hickey
*Attorney, Agent, or Firm*—Pennie & Edmonds

[57] ABSTRACT

The nickel-cadmium battery monitor is provided with sensors for measuring the battery temperature, the battery voltage and the magnitude of the current being charged to the battery, each of the sensors generating a sensor signal voltage that varies directly with the magnitude of the parameter being measured. The sensor signal voltages from the temperature sensor and the voltage sensor are conditioned and then converted to an analog signal voltage increment the magnitude of which corresponds approximately to the actual magnitude of the battery temperature and battery voltage as measured. The analog signal voltage increments thus obtained cause an analog visual display means to indicate visually the approximate magnitude of the battery temperature and battery voltage as measured. The conditioned analog signal voltages from the temperature sensor and the voltage sensor are also converted to a multibit digital signal which causes a digital visual display means to display in numeric form the actual magnitude of the battery temperature or battery voltage as measured. Charge rate sampling means continuously measures the magnitude of successive samples of the charge current and transmits an alarm signal to a flash alarm means when the rate of increase in the charge current exceeds a predetermined value. The flash alarm means transmits flash alarm signal to the digital visual display means when the temperature of the battery exceeds a predetermined value or when the voltage of the battery falls below or exceeds a predetermined value or when the charge rate sampling means transmits an alarm signal to the flash alarm means.

6 Claims, 2 Drawing Figures

NICKEL-CADMIUM BATTERY MONITOR

BACKGROUND OF THE INVENTION

1. Field of Invention

This invention relates to a device for monitoring the condition of a nickel-cadmium battery.

2. Prior Art

Nickel-cadmium batteries, comprising a plurality of nickel-cadmium voltaic cells connected in series, possess a number of highly desirable characteristics that include a relatively high capacity to weight ratio, a relatively flat voltage to percent of discharge curve, good performance at low temperatures, the capability of delivering high amperage currents for engine starting and similar purposes, and a relatively high recharge recycling capacity. Moreover, the chemistry of the nickel-cadmium system is such that nickel-cadmium cells may be hermetically sealed which permits operation in any position and in inaccessible locations. All of these characteristics have made nickel-cadmium batteries particularly well suited for use in aircraft and similar environments.

Aircraft electric systems normally include a rechargeable storage battery (for example, a nickel-cadmium battery) and a constant potential battery charging apparatus (for example, an alternator and voltage regulator) connected to the battery for restoring and maintaining its charge. However, when a nickel-cadmium battery is connected to a constant potential source of charging current the battery is susceptible to a malfunction known as "thermal runaway" which is a condition that can destroy the battery if undetected and unchecked. That is to say, when the battery temperature exceeds about 160°F, the battery voltage decreases as the temperature rises. Moreover, the temperature of the battery tends to rise when the battery is being charged by a charging current from a constant potential charging current source. If, for some reason, the battery temperature should rise above the critical value of about 160°F., the voltage of the battery may be lowered to the point where the charge current drawn by the battery increases sharply. This results in a further increase in temperature accompanied by a further voltage drop and still higher current consumption. Thus, a vicious cycle is created which will destroy the cell if undetected and allowed to go unchecked.

When nickel-cadmium batteries were first installed in aircraft the only battery monitoring devices employed were the usual ammeter to indicate battery discharge and charge rates and voltmeter to indicate the voltage at the battery terminals. The need for an additional instrument to detect and warn the pilot of incipient "thermal runaway" immediately became apparent, and battery monitors for the detection of "thermal runaway" are now mandatory equipment in aircraft.

Conventional monitors for the detection of incipient thermal runaway comprise a sensor for measuring the temperature of the nickel-cadmium battery and means for alerting the pilot (for example, a buzzer) when the temperature of the battery exceeds a predetermined value. When the battery temperature exceeds the predetermined value and the alarm is sounded, the pilot must disconnect the battery from the battery charging equipment and land the aircraft as quickly as possible. However, if the alarm activation temperature is set low enough to give the pilot sufficient time to take appropriate action to prevent battery destruction, the device will often give a "false alarm" of incipient thermal runaway when in fact the condition of the battery is perfectly stable. In order to prevent such false alarms the alarm activation temperature must be set so high (that is, only a few degrees below the critical temperature) that the pilot will often have insufficient time to take action to prevent battery destruction. Accordingly, it will seem that conventional nickel-cadmium battery monitoring devices are inherently unsatisfactory and, to some degree, unreliable.

After an intensive investigation of the problems inherent in the design of a satisfactory and reliable monitor for nickel-cadmium batteries, we have found that battery temperature is but one of the critical indicators of the condition of nickel-cadmium batteries. Low battery voltage is an indication of battery failure (for example, a dead cell) or charging equipment malfunction or failure. High charging voltage is an indication of malfunction of the battery charging equipment, and the resulting high charging current can lead directly to high battery temperatures and "thermal runaway" as previously described. Perhaps the most important indication of incipient thermal runaway is an excessive increase in the charging current within a short period of time. None of the nickel-cadmium battery monitoring devices heretofore known is capable of measuring these critical battery parameters.

As a result of our investigation we have now devised a new nickel-cadmium battery monitoring device that continuously monitors the most critical battery parameters — namely, the battery temperature, the battery voltage and the rate of change in the battery charging current. The magnitude of the battery temperature and voltage is continuously visually displayed to the pilot, and a visual and audible alarm alerts the pilot whenever the voltage of the battery falls below or exceeds a predetermined value, whenever the temperature of the battery exceeds a predetermined value or whenever the rate of increase in the charging current exceeds a predetermined value. The instrument of the invention employs solid state circuitry throughout and is sturdy and reliable in operation.

SUMMARY OF THE INVENTION

Our new device for monitoring nickel-cadmium batteries comprises a sensor for measuring the temperature of the battery, a sensor for measuring the voltage at the terminals of the battery and a sensor for measuring the magnitude of the current being discharged by and being charged to the battery, each of said sensors generating a sensor signal voltage that varies directly with the magnitude of the parameter being measured. A temperature sensor signal voltage conditioning and calibrating means is electrically connected to the temperature sensor, and a voltage sensor signal conditioning and calibrating means is electrically connected to the voltage sensor. Each of the conditioning and calibrating means transforms the sensor signal voltage from the sensor connected thereto to a conditioned analog signal voltage, the magnitude of the conditioned signal voltage being in the same relative proportion to a predetermined reference voltage as the actual magnitude of the battery parameter being measured is to a predetermined reference magnitude of this parameter. Continuous voltage gradient to incremental voltage gradient converter means are electrically connected to each of said signal voltage conditioning and calibrating means. The continuous to incremental voltage gradient converter means divides the continuous voltage gradient transmitted by the signal voltage conditioning and calibrating means into a predetermined number of incrementally increasing analog signal voltage increments, whereby the actual signal voltage from each of said signal voltage conditioning and calibrating means is converted to an analog signal voltage increment the magnitude of which corresponds approximately to the actual magnitude of the battery temperature and battery voltage as measured. Analog signal voltage increment indicator means are electrically connected to each of the continuous to incremental voltage gradient converter means, each of said indicator means having a plurality of electrically energized visual display means. Each of the visual display means corresponds to and is indirectly energized by one of the analog signal voltage increments, whereby the indicator means visually indicates the approximate magnitude of the battery temperature and battery voltage as measured.

Selector switch means are also electrically connected to each of the signal voltage conditioning and calibrating means, the selector switch being adapted to select and transmit the conditioned analog signal from the temperature signal conditioning and calibrating means or the voltage signal conditioning and calibrating means to an analog to digital converter means. Analog to digital converter means are electrically connected to the selector switch means, the converter means converting the selected conditioned analog signal to a corresponding multibit digital signal. An array of numeric visual display units are electrically connected to the analog to digital converter means, the display units displaying in numeric form the actual magnitude of the battery temperature or the battery voltage, as selected by said selector switch means.

Charge rate sampling means are electrically connected to the battery charge sensor, the sampling means continuously measuring the magnitude of successive samples of the charge current and transmitting an alarm signal to a flash alarm means when the rate of increase of the charge current exceeds a predetermined values. In the preferred embodiment the charge rate sampling means continuously measures successive samples of the charge current and records a "bit" in a memory element of the sampling means each time the magnitude of the charge current of a given current sample exceeds by a predetermined amount the charge current of the immediately preceeding current sample. The sampling means transmits an alarm signal to the flash alarm means when the number of current samples (or "bits") recorded in the memory element during a predetermined period of time exceeds a predetermined number of bits. The flash alarm means is electrically connected to each of the aforesaid continuous to incremental voltage gradient converter means and to the aforesaid charge rate sampling means. The flash alarm means transmits a flash alarm signal to the analog-to-digital converter means when the temperature of the battery exceeds a predetermined value, or when the voltage of the battery falls below or exceeds a predetermined value, or when an alarm signal is received from the charge rate sampling means.

BRIEF DESCRIPTION OF THE DRAWINGS

The nickel-cadmium monitoring device of the invention will be better understood from the following description thereof in conjunction with the accompanying drawings of which.

DESCRIPTION OF THE PREFERRED EMBODIMENT

Figure 1:
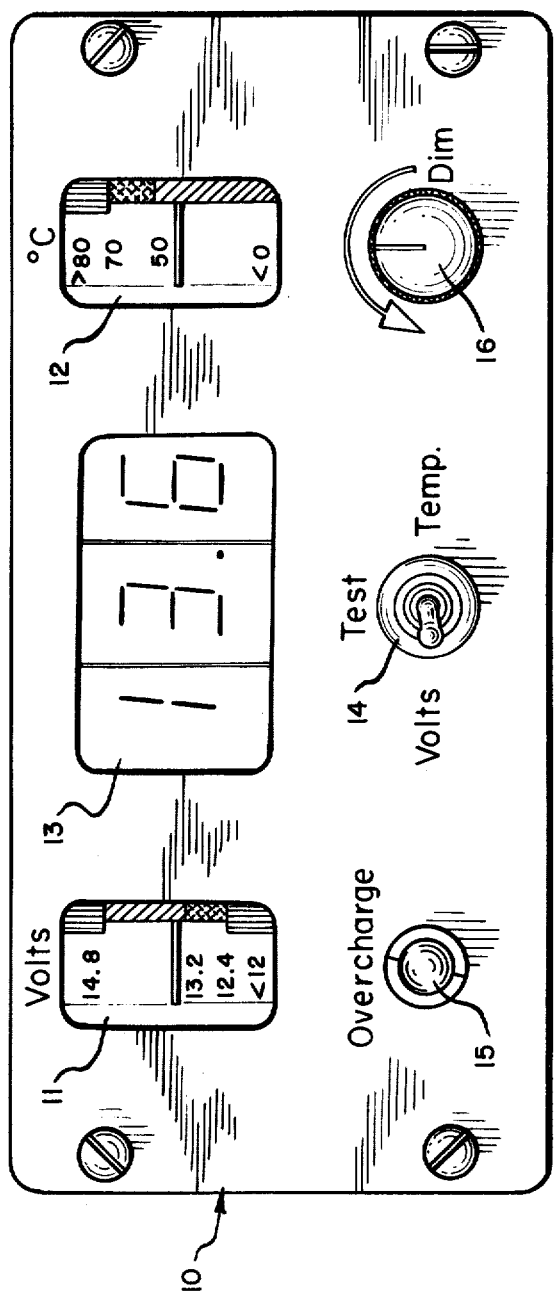
FIG. 1 is a front elevation of an advantageous embodiment of the visual display and control panel of the device.

Nickel-cadmium batteries have a number of highly desirable characteristics that make them particularly well secured for use in aircraft and similar environments. However, as previously described, nickel-cadmium batteries are susceptible to a malfunction known as "thermal runaway" which is a condition that can destroy the battery if undetected and allowed to go unchecked. The battery monitor of the invention continuously measures the temperature of the battery, the voltage of the battery, and the rate of change, if any, of the battery charging current. The magnitude of the battery temperature and the battery voltage is continuously visually displayed to the pilot, and a visual and audible alarm alerts the pilot whenever the voltage of the battery falls below or exceeds a predetermined value, whenever the temperature of the battery exceeds a predetermined value and whenever the rate of increase in the battery charge current exceeds a predetermined value. In addition, the temperature and battery displays are provided with "red," "yellow" and "green" zones or ranges which indicate the dangerous, cautionary and normal magnitudes of these battery parameters.

The critical values of the battery temperature, battery voltage and battery charging rate which trigger the alarm will vary somewhat from one nickel-cadmium battery to another depending upon the construction of the battery, its nominal voltage, the characteristics of the charging system and similar factors. In the ensuing description, it will be assumed that the battery comprises 10 cells each having a nominal voltage of 1.25 volts for a total of 12.5 volts at the battery terminals and also that the battery is in a "thermal runaway" condition when the temperature of the battery exceeds about 160°F. (71°C).

When the battery is connected to and being charged by the constant potential battery charging system of the aircraft, the voltage at the battery terminals is normally between 13.2 and 14.8 volts. A voltage of less than 12.4 volts at the battery terminals indicates a serious malfunction of the electrical system, such as a short-circuited cell in the battery or a failure of the battery charging system. Accordingly, when the battery voltage falls below 12.4 volts the voltage shown by the voltage display will be in the red (danger) range of the display and the alarm circuit of the battery monitor will be triggered. A voltage of between 12.4 and 13.2 volts indicates a possible malfunction of the battery charging system, and when the battery voltage falls within this range the voltage shown by the voltage display will be within the yellow (warning) range of the display. A voltage of between 13.2 and 14.8 is normal, and when the battery voltage falls within this range the voltage shown by the display will be within the green range of the display. A voltage in excess of 14.8 indicates a potentially dangerous malfunction of the battery charging system, and when the battery voltage exceeds 14.8 volts the voltage shown will fall within another red (danger) range of the display and the alarm circuit of the monitor will be triggered. Similarly, when the temperature of the battery is below 122°F. (50°C) the temperature shown by the temperature display will be within the green range of the display, when the battery temperature is between 122° and 158°F. (50° to 70°C) the temperature shown by the display will be within the yellow (warning) range, and when the battery temperature exceeds 158°F. (70°C) the temperature shown by the display will be in the red (danger) range and the alarm circuit of the monitor will be triggered. Finally, the battery charge rate monitoring circuit of the device is adjusted to trigger the alarm circuit when the increase in charge rate within a predetermined period of time exceeds a predetermined value as hereinafter more fully described.

Referring now to FIG. 1 of the drawing, the battery monitor of the invention has a compact control and data display panel 10 that is designed to fit in a standard instrument opening (about 3 × 6 inch) in the instrument panel of the aircraft. The externally visible components of the panel 10 include an analog signal visual display means 11 for indicating the approximate value of the battery voltage, an analog signal visual display means 12 for indicating the approximate value of the battery temperature, an array of three digital visual display units 13 for indicating in numeric form the precise voltage of the battery voltage or the battery temperature, a selector switch 14 for selecting either the battery voltage or the battery temperature for display by the visual display units 13, an overcharge warning light 15 and a dimmer control knob 16.

In the embodiment of the device shown in FIG. 1 the analog signal visual display means 11 and 12 are so-called "10-bar indicators" which are available from commercial suppliers. A 10-bar indicator comprises an integrated group of 10 horizontally disposed rod-like light sources which are positioned one above the other to provide a vertical array or stack of horizontal light sources. The 10-bar indicator is designed to operate within a predetermined range of indicator control voltages. At the lowest control voltage within the predetermined range and the lowermost of the horizontal light sources in the light stack is illuminated, at a mid-range control voltage one of the middle (say the fifth) horizontal light source is illuminated, and at the highest control voltage within the predetermined range the uppermost horizontal light source is illuminated.

The battery voltage sensor and the battery temperature sensor each generate a sensor signal voltage that corresponds to the actual magnitude of the battery voltage and battery temperature as measured. This measured signal voltage falls within a range of signal voltages the minimum and maximum values of which correspond to the minimum and maximum values of the parameter being monitored. The analog signal voltages within the aforesaid range comprise a continuous voltage gradient that corresponds to the continuous range of values within the minimum and maximum values of the parameters being monitored. The analog signal voltage gradient is "conditioned" to coincide with the predetermined range of control voltage of the 10-bar indicator. The conditioned analog signal voltage is then divided into 10 increments, each voltage increment being of the specific control voltage value that will cause one of the horizontal light sources of the 10-bar indicator to be illuminated. Thus, as the conditioned analog signal voltage corresponding to the operating parameter being measured increases incrementally from a predetermined minimum voltage to a predetermined maximum voltage, the horizontal light sources of the 10-bar indicator will be illuminated one at a time starting with the lowermost horizontal light source and progressing upwardly to the uppermost horizontal light source as the analog signal voltage increases. By proper calibration of the analog signal voltage and the 10-bar indicator, the position of the illuminated horizontal light source of the 10-bar indicator provides a reliable indication of the approximate value of the operating parameter being measured. As noted, the 10-bar indicators are color coded so that the pilot can ascertain at a glance whether the battery voltage and battery temperature are within the safe (green) range of magnitude, or whether the voltage or temperature has risen above or fallen below the safe range and is in a cautionary (yellow) or danger (red) range for that parameter.

Other types of analog signal visual display means may be employed in place of the aforementioned 10-bar indicators. one such analog signal display means are the so-called "tri-lights" which are also available from commercial electronic suppliers. A tri-light comprises three separate incandescent filaments within a single glass envelope each filament being masked by a color filter — namely, red filter, a yellow filter and a green filter. The analog signal voltage corresponding to a particular battery parameter being monitored is conditioned, and the conditioned signal voltage is being divided into a predetermined number of analog signal voltage increments as previously described. The analog signal voltage increments corresponding to battery parameter magnitudes falling within the safe range of operation will cause the green filtered filament of the tri-light to be illuminated. Similarly, analog signal voltage increments corresponding to battery parameter magnitudes that fall below or exceed the safe operating range will cause the yellow filtered or the red filtered filament of the tri-light to be illuminated, as may be appropriate to the specific circumstances.

The array of integrated digital visual display units 13 are advantageously incandescent displays which are available from commercial electronic suppliers. Other types of digital display units that may be used include liquid crystals of the light reflective or light transmissive type, fiber optic readouts, and light emitting diode (LED) readouts all of which are available from commercial electronic suppliers.

The selector switch 14 advantageously is a three position toggle switch as shown in FIG. 1. Alternatively it may comprise a rotary switch or a cylinder switch of conventional design. The overcharge warning light 15 is advantageously a light emitting diode, although it may comprise any conventional light source. The dimmer control knob 16 permits manual adjustment of a conventional dimmer circuit which controls the brightness of the visual displays 11, 12 and 13.

Figure 2:
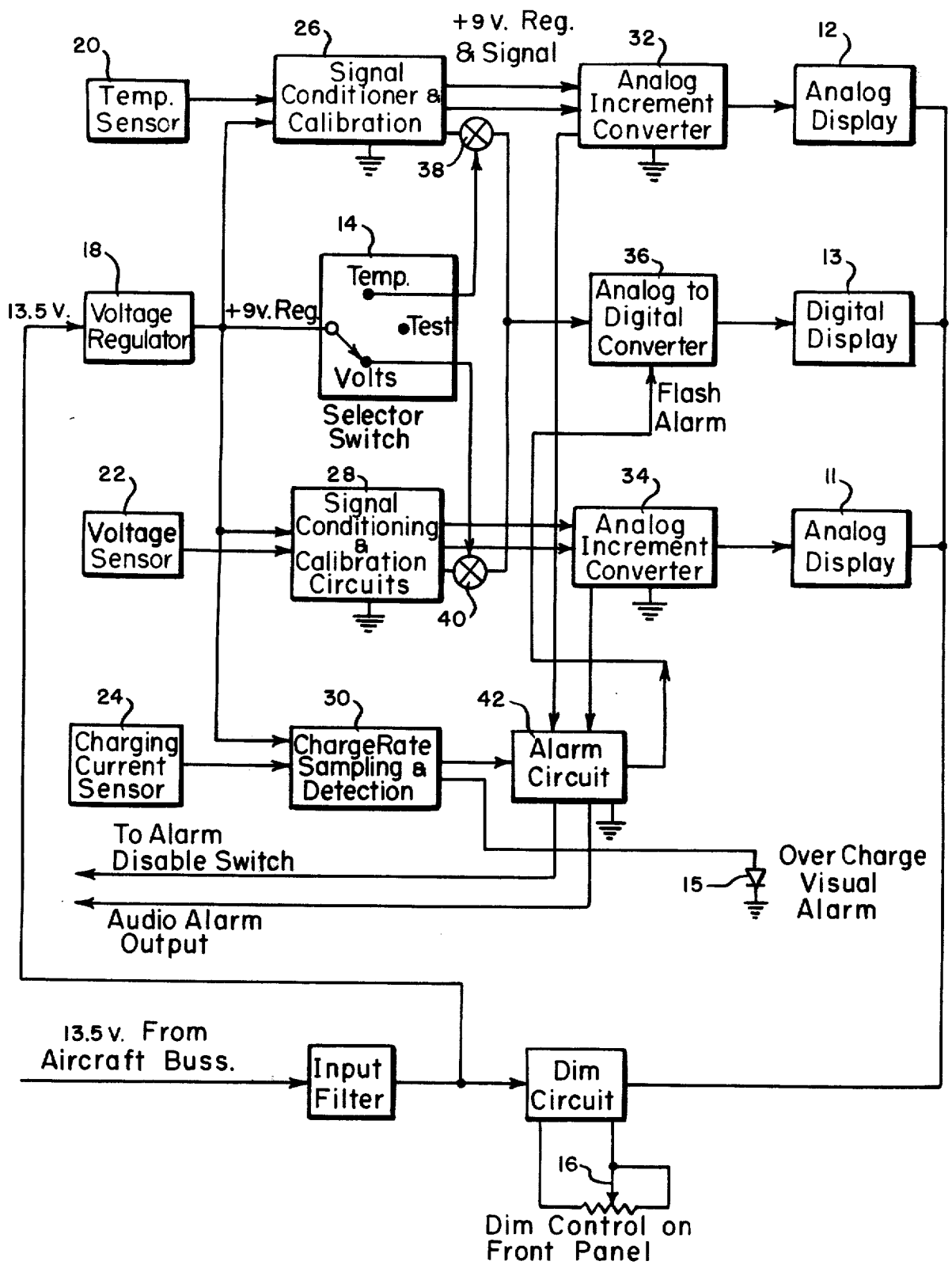
FIG. 2 is a block diagram of the various functional components of the device showing how these components are electrically interconnected as hereinafter described.

The organization and interrelationship of the various functional components of the device which sense the magnitude of the various battery parameters being monitored and which transmit data relating to these parameters to the display panel 10 are shown in FIG. 2 of the drawings. Solid state components are used throughout the device. The parameter monitoring sensors are all of known design and may be obtained from commercial suppliers of such equipment. Similarly, the various functional components referred to in FIG. 2 of the drawings as signal conditioning and calibrating units, analog increment converter units (continuous to incremental voltage gradient converter means), analog display units, the analog to digital converter unit, the digital display unit, the voltage regulator, the alarm circuit, the dim circuit and the like are of known design and may be obtained from commercial sources or may be assembled from basic electronic components by any competant electronic technician who knows the intended function of the unit. It is the organization and interrelationship of these known functional components into the battery monitoring device described herein that comprises our unique contribution to the art.

As shown in FIG. 2 of the drawings, a voltage regulator 18 is connected to the aircraft power supply (normally about 13.5 volts) to provide a closely regulated 9 volt power supply for the various functional components of the device. A temperature sensor 20 is provided for measuring the temperature of the battery, a voltage sensor 22 is provided for measuring the voltage of the battery and a charging current sensor 24 is provided for measuring the magnitude (amperes) of the current being charged to the battery. Each of the aforesaid battery parameter sensors 20, 22 and 24 generates a sensor signal voltage that varies directly with changes in the magnitude of the parameter being measured. The sensor signal voltage generated by the temperature sensor 20 and by the voltage sensor 22 must be transformed into "conditioned" signal voltages the minimum and maximum values of which coincide with the minimum and maximum values of the control voltages for the analog signal visual display means 11 and 12 (labeled "analog display" in FIG. 2) as hereinbefore described. Accordingly, the sensor signal voltage from the temperature sensor 20 is transmitted to a sensor signal voltage conditioning and calibrating means 26, and the sensor signal voltage from the voltage sensor 22 is transmitted to a sensor signal voltage conditioning and calibrating means 28. The sensor signal voltage generated by the charging current sensor 24 is transmitted to charge rate sampling and detection means 30 where the rate of increase in the charge current, if any, is measured as hereinafter described.

As noted, the sensor signal voltage conditioning and calibrating means 26 transforms the sensor signal voltage from the temperature sensor 20 to a conditioned signal voltage the minimum and maximum values of which coincide with the minimum and maximum values of the control voltages for the analog display unit 12. The conditioned analog signal voltage produced by the voltage conditioning and calibrating means 26 varies directly with the sensor signal voltage generated by the sensor 20. Thus, continuous rise or decline in the sensor signal voltage will result in a continuous rise or decline in the conditioned analog signal voltage, the aforementioned minimum and maximum values of the conditioned analog signal being the lower and upper limits of a continuous voltage gradient. The exact value of the conditioned analog signal voltage at any moment in time corresponds to the sensor signal voltage at that moment which, in turn, is determined by the actual magnitude of the battery temperature as measured.

The conditioned analog signal voltage from the conditioning and calibrating means 26 is transmitted to a continuous voltage gradient to incremental voltage gradient converter means 32 (labeled "analog increment converter" in FIG. 2). The continuous to incremental voltage gradient converter means 32 divides the continuous voltage gradient of the conditioning analog signal voltage into a predetermined number of incrementally increasing analog signal voltage increments (say, ten approximately equal step-wise voltage increments). The magnitude of each analog signal voltage increment corresponds to a small segment of the continuous voltage gradient of the conditioned analog signal voltage produced by the conditioning and calibrating means 26. Accordingly, the actual signal voltage from the signal voltage and calibrating means 26 is converted by the continuous to incremental voltage gradient converter means 32 to an analog signal voltage increment the magnitude of which corresponds approximately to the actual magnitude of the battery temperature as measured. The analog signal voltage increment is then transmitted to the analog display unit 12 where it causes the approximate value of the battery temperature to be visually displayed to the pilot.

By way of example, it will be assumed that the temperature sensor 20 generates a sensor signal voltage that rises from about 0.3 volts to about 0.6 volts as the temperature of the battery rises from about 0°C. to above 80°C. It will also be assumed that the display control voltages for the analog display 12 (a 10-bar indicator) are: 3.0, 3.3, 3.7, 4.0, 4.3, 4.7, 5.0, 5.3, 5.7 and 6.0 volts. The analog signal conditioning and calibrating means 26 transforms the sensor signal voltage to a conditioned analog signal voltage the minimum and maximum values of which correspond to the minimum and maximum values of the display control voltages for the analog display 12. The continuous voltage gradient produced by the conditioning and calibration means 26 is converted by the analog increment converter 32 to an incremental voltage gradient in which each voltage increment corresponds to one of the aforementioned display control voltages of the analog display 12. As a result, as the temperature of the battery increases from 0°C. to slightly over 80°C., the conditioned analog signal voltage will increase in step-wise control voltage increments and the horizontal light sources of the analog display 12 will be illuminated one at a time from the lowermost light source to the uppermost light source. Specifically, in FIG. 1 of the drawings the analog display 12 indicates that the temperature of the battery is approximately 40°C. In the assumed example, this temperature is indicated by the analog display 12 when the sensor signal voltage is within the range of 0.42 to 0.45 volts which, when conditioned and converted to an analog signal voltage increment, provides an analog display control voltage of 4.3 volts at the analog display unit.

In the same manner, the sensor signal voltage generated by the voltage sensor 22 is transformed to the corresponding conditioned analog signal voltage by the sensor signal voltage conditioning and calibrating means 28. The conditioned analog signal voltage thus produced is converted to the corresponding analog signal voltage increment by the continuous to incremental voltage gradient converter means 34 (labeled "analog increment converter" in FIG. 2), and this analog signal voltage increment is transmitted to the analog signal voltage increment indicator means 11 (labeled "analog display" in FIG. 2) which visually displays the approximate value of the battery voltage to the pilot.

The magnitude of the battery temperature and the voltage measured by the sensors 20 and 22 may also be selectably displayed in numeric form by the array of digital display units 13 at the display panel 10. As shown in FIG. 2, the temperature analog signal conditioning and calibrating means 26 and the voltage analog signal conditioning and calibrating means 28 are electrically connected to the analog to digital signal converter means 36. Normally open solid state switches 38 and 40 (for example, a transister) are disposed in each of the lines connecting the signal voltage conditioning and calibrating means 26 and 28 to the analog to digital converter means 36. A selector switch 14 connected to the solid state switches 38 and 40 determines which one of the conditioned analog signal voltages produced by the signal voltage conditioning and calibration means 26 and 28 is to be transmitted to the analog to digital converter means 36. The analog to digital converter means 36 converts the selected conditioned analog signal to a corresponding multibit digital signal which, in turn, is transmitted to the array of digital display units 13 where the actual magnitude of the battery parameter being measured is displayed in numeric form. Specifically, in FIG. 1 of the drawing the analog display 11 indicates that the battery voltage is approximately 13.2 volts. When the selector switch 14 is positioned to energize the solid state switch 40 as shown in FIGS. 1 and 2, the digital display unit 13 indicates the actual value of the battery voltage — namely, 13.6 volts.

The temperature analog increment converter 32 and the voltage analog increment converter 34 are connected to a flash alarm generating means 42 (labeled "alarm circuit" in FIG. 2), and the flash alarm generator means 42 is connected to the analog to digital converter 36. When the temperature of the battery rises to 70°C. or above, the temperature analog increment converter 32 transmits an alarm signal to the alarm circuit 42 which, in turn, transmits a flash alarm signal to the analog to digital converter 36. Similarly, when the battery voltage falls below 12.4 volts or rises above 14.8 volts, the voltage analog increment converter 34 transmits an alarm signal to the alarm circuit 42 which transmits a flash alarm signal to the analog to digital converter 36. The flash alarm signal transmitted to the analog to digital converter 36 causes the digital display 13 to flash rapidly. The flashing digital display alerts the pilot to the fact that one or more of the battery parameters has exceeded (or fallen below) its predetermined critical magnitude and warns him to take appropriate action. The alarm circuit is also connected to an audible alarm means (for example, a buzzer not shown) which sounds an alarm when one or more of the battery parameters exceeds or falls below its critical magnitude.

As noted, the battery charge current sensor 24 is connected to the charge rate sampling and detection means 30. The sampling and detection means 30 continuously measures successive samples of the charge current and records a data "bit" in a memory element (a "bit" counter) of the device each time the magnitude of the charge current of a given current sample exceeds by a predetermined amount the magnitude of the charging current of the immediately preceeding current sample. Whenever the number of data "bits" recorded in the memory element within a predetermined period of time exceeds a predetermined number of "bits," the sampling and detection means 30 transmits an alarm signal to the alarm circuit 42 and also to the overcharge visual signal light 15 on the control panel 10. The alarm circuit 42 transmits a flash alarm signal to the analog to digital coverter 36 and also causes the audible alarm signal to sound.

In an advantageous embodiment of the device the current sampling and detection means continuously measures the magnitude of successive 10-second samples of the charge current (that is, current samples of 10 seconds duration). The magnitude of the current sample being measured at any given time is compared to the magnitude of the immediately preceeding current sample, and whenever the magnitude of the present current sample exceeds that of the preceeding sample by 0.3 amperes a data "bit" is entered in the memory element (a "bit" counter) of the device. After 30 such 10-second current samples have been measured and compared (representing a 5 minute current sampling period), the memory element is interrogated and whenever 20 or more data "bits" are found to have been recorded in the memory element within the 5 minute current sampling period an alarm signal is transmitted to the alarm circuit 42 and the overcharge light 15 as previously described. At the end of each 5 minute sampling period the memory element is reset at zero and a new 5 minute sampling period is commenced.

When the alarm circuit 42 transmits a flash alarm signal to the analog to digital converter 36, the digital display 13 is caused to flash rapidly no matter what data may be being displayed at the time. That is to say, although the digital display may be displaying the battery voltage as shown in FIG. 1, the display 13 will flash rapidly when the battery temperature or the rate of increase in the charge current exceed their predetermined critical values as well as when the battery voltage exceeds or falls below its predetermined critical values. Moreover, after the pilot has been alerted to the existence of a battery malfunction by the flashing of the digital display 13 and by the audible alarm, and after the pilot has instituted appropriate action, he may wish to silence the alarm. To this end, an alarm disable switch (not shown) may be provided.

We claim:
1. Device for monitoring nickel-cadmium battery which comprises:
   a sensor for measuring the temperature of the battery, a sensor for measuring the voltage at the terminals of the battery and a sensor for measuring the magnitude of the current being discharged by and being charged to the battery, each of said sensors generating a sensor signal voltage that varies directly with the magnitude of the parameter being measured;
   a temperature sensor signal voltage conditioning and calibrating means electrically connected to the temperature sensor, and a voltage sensor signal voltage conditioning and calibrating means electrically connected to the voltage sensor, each of said conditioning and calibrating means transforming the sensor signal voltage from the sensor connected thereto to a conditioned analog signal voltage the magnitude of which is in the same relative proportion to a predetermined reference voltage as the actual magnitude of the battery temperature is to a predetermined reference battery temperature and as the actual magnitude of the battery voltage is to a predetermined reference battery voltage;
   continuous voltage gradient to incremental voltage gradient converter means electrically connected to each of said signal voltage conditioning and cali- brating means, said converter means dividing the continuous voltage gradient of the conditioned analog signal voltage into a predetermined number of incrementally increasing analog signal voltage increments, whereby the actual signal voltage from each said signal voltage conditioning and calibrating means is converted to an analog signal voltage increment the magnitude of which corresponds approximately to the actual magnitude of the battery temperature and battery voltage as measured;

analog signal voltage increment indicator means electrically connected to each of the continuous to incremental voltage gradient converter means, each of said indicator means having a plurality of electrically energized visual display means, each of said display means corresponding to and being energized by one of said analog signal voltage increments, whereby said indicator means visually indicates the approximate magnitude of the battery temperature and battery voltage as measured;

selector switch means also electrically connected to each of the signal voltage conditioning and calibrating means, said selector switch being adapted to select and transmit the conditioned analog signal from the temperature signal or the voltage signal conditioning and calibrating means to an analog to digital converter means;

analog to digital converter means electrically connected to said selector switch means, said converter means converting the selected conditioned analog signal to a corresponding multibit digital signal;

an array of numeric visual display units electrically connected to said analog to digital converter means, said display units displaying in numeric form the actual magnitude of the battery temperature or the battery voltage, as selected by said selector switch means;

charge rate sampling means electrically connected to the battery charge sensor, said sampling means continuously measuring the magnitude of successive samples of the charge current and transmitting an alarm signal to a flash alarm means when the rate of increase of the charge current exceeds a predetermined values; and flash alarm means electrically connected to each of said continuous to incremental voltage gradient converter means and to said charge rate sampling means, said alarm means transmitting a flash alarm signal to the analog to digital converter means when the temperature of the battery exceeds a predetermined value or when the voltage of the battery falls below or exceeds a predetermined value or when an alarm signal is received from the charge rate sampling means.

2. The device according to claim 1 in which the charge rate sampling means continuously measures successive samples of the charge current and records in a memory element each time the magnitude of the charge current of a given current sample exceeds by a predetermined amount the magnitude of the charge current of the immediately preceeding current sample, said sampling means transmitting an alarm signal to a flash alarm means when the number of current samples recorded in the memory element of the sampling means during a predetermined period of time exceeds a predetermined number.

3. Device for monitoring a nickel-cadmium battery which comprises:

a sensor for measuring the temperature of the battery, a sensor for measuring the voltage at the terminals of the battery and a sensor for measuring the magnitude of the current being discharged by and being charged to the battery, each of said sensors generating a sensor analog signal voltage that varies directly with the magnitude of the parameter being measured;

analog signal voltage indicator means for said temperature analog signal and for said voltage analog signal, each of said indicator means having a plurality of electrically energized visual display means, each of said display means corresponding to an analog signal voltage increment, whereby said indicator means visually indicates the approximate magnitude of the battery temperature and battery voltage is measured;

selector switch means adapted to select and transmit either the temperature analog signal or the voltage analog signal to a digital display means;

digital display means comprising an array of visual display units displaying in numeric form the actual magnitude of the battery temperature or the battery voltage, as selected by said selector switch means;

charge rate sampling means electrically connected to the battery charge sensor, said sampling means continuously measuring the magnitude of successive samples of the charge current and transmitting an alarm signal to a flash alarm means when the rate of increase of the charge current exceeds a predetermined values; and flash alarm means transmitting a flash alarm signal to the digital display means when the temperature of the battery exceeds a predetermined value or when the voltage of the battery falls below or exceeds a predetermined value or when an alarm signal is received from the charge rate sampling means.

4. The device according to claim 3 in which:

a temperature sensor signal voltage conditioning and calibrating means is electrically connected to the temperature sensor and a voltage sensor signal voltage conditioning and calibrating means is electrically connected to the voltage sensor, each of said conditioning and calibrating means transforming the sensor signal voltage from the sensor connected thereto to a conditioned analog signal voltage the magnitude of which is in the same relative proportion to a predetermined reference voltage as the actual magnitude of the battery temperature is to a predetermined reference battery temperature and as the actual magnitude of the battery voltage is to a predetermined reference battery voltage;

a continuous voltage gradient to incremental voltage gradient converter means is electrically connected to each of said signal voltage conditioning and calibrating means, said converter means dividing the continuous voltage gradient of the conditioned analog signal voltage into a predetermined number of incrementally increasing analog signal voltage increments, whereby the actual signal voltage from each said signal voltage conditioning and calibrating means is converted to an analog signal voltage increment the magnitude of which corresponds approximately to the actual magnitude of the battery temperature and battery voltage as measured; and an analog signal voltage increment indicator means is electrically connected to each of the continuous to incremental voltage gradient converter means, each of said indicator means having a plurality of electrically energized visual display means, each of said display means corresponding to and being energized by one of said analog signal voltage increments, whereby said indicator means visually indicates the approximate magnitude of the battery temperature and battery voltage as measured.

5. The device according to claim 3 in which the selector switch means selects and transmits either the temperature analog signal or the voltage analog signal to an analog to digital converter means;

analog to digital converter means are electrically connected to said selector switch means, said converter means converting the selected conditioned analog signal to a corresponding multibit digital signal; and an array of digital visual display units are electrically connected to said analog to digital converter means, said display units displaying in numeric form the actual magnitude of the battery temperature or the battery voltage, as selected by said selector switch means.

6. The device according to claim 3 in which the charge rate sampling means continuously measures successive samples of the charge current and records in a memory element each time the magnitude of the charge current of a given current sample exceeds by a predetermined amount the magnitude of the charge current of the immediately preceding current sample, said sampling means transmitting an alarm signal to a flash alarm means when the number of current samples recorded in the memory element of the sampling means during a predetermined period of time exceeds a predetermined number.

* * * * *